(12) United States Patent
Magadum et al.

(10) Patent No.: US 9,281,840 B2
(45) Date of Patent: Mar. 8, 2016

(54) SYSTEM AND METHOD FOR MULTI STANDARD PROGRAMMABLE LDPC DECODER

(71) Applicant: Saankhya Labs Private Limited, Bangalore (IN)

(72) Inventors: Abhijeet Balasaheb Magadum, Hukkeri (IN); Guruprasad Rachayya Timmapur, Dharwad (IN); Susmit Kumar Datta, Bangalore (IN)

( * ) Notice: Subject to any disclaimer, the term of this patent is extended or adjusted under 35 U.S.C. 154(b) by 105 days.

(21) Appl. No.: 14/211,616

(22) Filed: Mar. 14, 2014

(65) Prior Publication Data

US 2015/0188569 A1    Jul. 2, 2015

(30) Foreign Application Priority Data

Dec. 30, 2013  (IN) .......................... 6175/CHE/2013

(51) Int. Cl.
| | |
|---|---|
| *H03M 13/00* | (2006.01) |
| *H03M 13/11* | (2006.01) |
| *G06F 11/10* | (2006.01) |
| *H04L 1/00* | (2006.01) |
| *H03M 13/27* | (2006.01) |

(52) U.S. Cl.
CPC ............... *H03M 13/11* (2013.01); *G06F 11/10* (2013.01); *H03M 13/114* (2013.01); *H03M 13/1137* (2013.01); *H03M 13/1165* (2013.01); *H03M 13/1168* (2013.01); *H03M 13/6505* (2013.01); *H03M 13/6519* (2013.01); *H03M 13/27* (2013.01); *H04L 1/0041* (2013.01); *H04L 1/0045* (2013.01); *H04L 1/0057* (2013.01)

(58) Field of Classification Search
CPC ..... H03M 13/11; H03M 13/27; H03M 13/23; H03M 13/2957; H04L 1/0057; H04L 1/0059; H04L 1/0041; G11B 20/1833
USPC .................................. 714/752, 774, 776, 786
See application file for complete search history.

(56) References Cited

U.S. PATENT DOCUMENTS

| | | | |
|---|---|---|---|
| 2008/0028282 A1* | 1/2008 | Zhong et al. ................... | 714/794 |
| 2009/0217122 A1* | 8/2009 | Yokokawa et al. ............ | 714/752 |
| 2010/0146360 A1* | 6/2010 | Trofimenko et al. .......... | 714/752 |
| 2010/0272227 A1* | 10/2010 | Dielissen ........................ | 377/69 |
| 2010/0318872 A1* | 12/2010 | Wang ............................. | 714/752 |
| 2011/0083060 A1* | 4/2011 | Sakurada et al. .............. | 714/763 |
| 2011/0320902 A1* | 12/2011 | Gunnam ........................ | 714/752 |
| 2012/0005551 A1* | 1/2012 | Gunnam ........................ | 714/752 |
| 2012/0221914 A1* | 8/2012 | Morero et al. ................. | 714/752 |

* cited by examiner

*Primary Examiner* — Albert Decady
*Assistant Examiner* — Osman Alshack
(74) *Attorney, Agent, or Firm* — The Law Office of Austin Bonderer, PC; Austin Bonderer

(57) ABSTRACT

A method for implementing multi standard programmable low-density parity check decoder in a receiver is provided. The method includes (i) generating, by a control signal generation unit, pre computed control signals associated with a h-matrix, (ii) obtaining, by a control signal storage unit of a hardware decoder unit, the pre computed control signals associated with the h-matrix, (iii) obtaining, by a LLR memory fetch & data align unit, LLR bytes from a LLR memory unit, (iv) rotating, by a rotation and aligning unit, the LLR bytes to obtain aligned valid LLR bytes, (v) processing, by the processing element unit, the aligned valid LLR bytes to obtain an output data, and (vi) decoding, the h-matrix associated with at least one standard and code rates based on the pre computed control signals.

12 Claims, 8 Drawing Sheets

SYSTEM AND METHOD FOR MULTI STANDARD PROGRAMMABLE LDPC DECODER

CROSS-REFERENCE TO RELATED APPLICATIONS

This application claims priority to Indian patent application no. 6175/CHE/2013 filed on Dec. 30, 2013, the complete disclosure of which, in its entirely, is herein incorporated by reference.

BACKGROUND

1. Technical Field

The embodiments herein generally relate to LDPC decoder, and, more particularly, to a system and method for implementing multi standard programmable LDPC decoder.

2. Description of the Related Art

Low-density parity-check (LDPC) code are a class of linear block codes which provide near capacity performance on a large collection of data transmission over noisy channels while simultaneously admitting implementable decoders. An LDPC code is specified by defining a matrix called H-matrix that indicates how parity bits are calculated. An H-matrix is a sparse matrix, but it is possible in many cases (e.g., DVB-T2/S2/C2) to rearrange the rows so that it forms a more regular structure. The H-matrix is composed of smaller sub-matrices. LDPC H-matrices are different across the standards and also they are different for different code rates within the same standard such as DVB-T2/S2/C2, 802.11, 802.3, 802.16, and CDMB-T etc. Therefore, due to this variation in the H-Matrices, existing LDPC decoders are designed to decode only a particular standard, hence they can't be used to decode other LDPC codes. One of the ways of implementing an LDPC decoder is to specifically target to a particular standard. A method of implementing the LDPC decoder could be, control signals for further processing are generated using hardware logic (e.g., an H-matrix parser module) where by reading memory associated with the H-Matrix. This option is restricted by the structure of the H-Matrix and its attributes like block length, maximum row weight, size of the sub matrix and number of rows in a layer etc. The H-matrix attributes are decoded by hardwired logic to generate control signals for the rest of the processing pipeline. When the attributes of the H-Matrix vary, hardware block fails to handle those variations. Hence this cannot implement different H-Matrices of various standards. If any other standards to be implemented in this architecture, then there is a need to make changes in the existing hardware architecture. Accordingly, there remains a need for a system and a method to design better LDPC decoder which supports different standards and to avoid a memory access conflicts without making changes in the existing hardware architecture.

SUMMARY

In view of the foregoing, an embodiment herein provides a system for implementing multi standard programmable low-density parity check decoder in a receiver. The system includes a control signal generation unit, that generates pre computed control signals associated with an h-matrix, and a hardware decoder unit. The hardware decoder unit includes a control signal storage unit, stores the pre computed control signals associated with the h-matrix; a LLR memory fetch & data align unit, obtains LLR bytes from a LLR memory unit; a rotation and aligning unit, performs a rotation on the LLR bytes to obtain aligned valid LLR bytes; the processing element unit, processes the aligned valid LLR bytes to obtain an output data; a de rotation unit, de-aligns the output data of the processing element unit; and an output processing unit, generates an output LLR bytes based on a feedback from at least one diagonals and a input LLR values. A number of LLR bytes that are fetched from the LLR memory unit is based on number of rows in a layer of the h-matrix. The aligned LLR bytes are communicated to the processing elements unit. The output data is an intermediate LLR value. A number of processing elements are enabled based on at least one of (i) a number of rows in a layer, and (ii) a location of active elements of the H-matrix within a current layer. The LLR bytes are shifted in a reverse direction based on the rotation.

The one or more sub matrices associated with the H-matrix may be a shifted identity-matrix with one or more diagonal. The p-number of processing elements may be present in a data path to process p-number of rows at a particular period. The pre computed control signals may be generated based on layer re-order information. The layer re-order information may include an order of layer processing. The control signal generation unit may be further configured to schedule a layer for processing when the layer in the H-matrix includes data dependency corresponding to at least one previous layer. A configurable hardware may be further configured to a LLR memory access unit that access a configurable number of LLR bytes from the memory. A number of LLR bytes accessed in a cycle may be based on at least one of (i) a number of rows in a layer, and (ii) a location of active elements of the H-matrix within a current layer. The H-Matrix may be not a shifted identity-matrix when one or more active element located at random locations. The one or more active element are mapped to corresponding at least one processing elements.

In another aspect, a method for implementing multi standard programmable low-density parity check decoder in a receiver is provided. The method includes (i) generating, by a control signal generation unit, pre computed control signals associated with a h-matrix, (ii) obtaining, by a control signal storage unit of a hardware decoder unit, the pre computed control signals associated with the h-matrix, (iii) obtaining, by a LLR memory fetch & data align unit, LLR bytes from a LLR memory unit, (iv) rotating, by a rotation and aligning unit, the LLR bytes to obtain aligned valid LLR bytes, (v) processing, by the processing element unit, the aligned valid LLR bytes to obtain an output data, and (vi) decoding, the h-matrix associated with one or more standard and code rates based on the pre computed control signals. A number of LLR bytes that are fetched from the LLR memory unit based on number of rows in a layer of the h-matrix. The aligned LLR bytes are communicated to a processing element unit. The output data is an intermediate LLR value. A number of processing elements are enabled based on at least one of (a) a number of rows in a layer, and (b) a location of active elements of the H-matrix within a current layer.

The one or more sub matrices associated with the H-matrix may be a shifted identity-matrix with at least one diagonal. The p-number of processing elements may present in a data path to process p-number of rows at a particular period. The pre computed control signals may be generated based on layer re-order information. The layer re-order information may include an order of layer processing. The control signal generation unit may be further configured to schedule a layer for processing when the layer in said H-matrix includes data dependency corresponding to at least one previous layer.

The method may further include a configurable number of LLR bytes from the memory may be obtained by a LLR memory access unit. A number of LLR bytes obtained in a cycle may be based on at least one of (i) a number of rows in a layer, and (ii) a location of active elements of the H-matrix within a current layer. The H-Matrix may be not a shifted identity-matrix when one or more active element located at random locations. The one or more active element are mapped to corresponding at least one processing elements. The method may further include the output data of the processing element unit may be de-aligned by a de rotation unit. The LLR bytes may be shifted in a reverse direction based on the rotation. The method may further include an output LLR bytes is generated by an output processing unit based on a feedback from one or more diagonals and an input LLR values.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which.

DETAILED DESCRIPTION OF PREFERRED EMBODIMENTS

Figure 1:
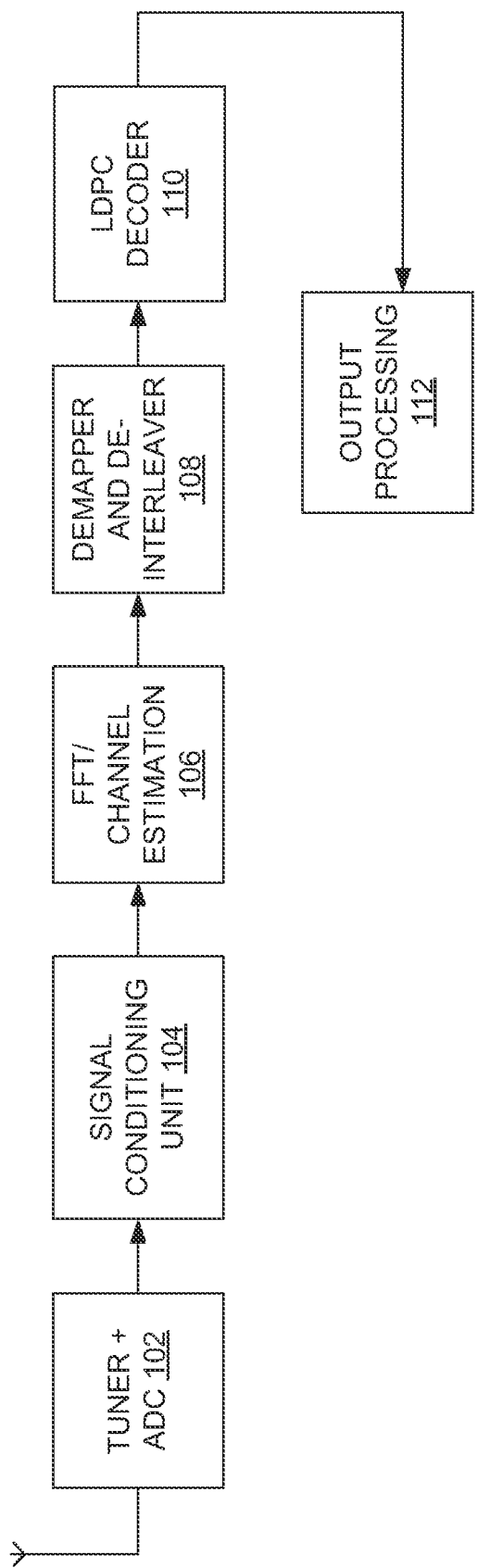
FIG. 1 is a block diagram illustrates an implementation of a low-density parity check decoder in a receiver according to an embodiment herein.

The embodiments herein and the various features and advantageous details thereof are explained more fully with reference to the non-limiting embodiments that are illustrated in the accompanying drawings and detailed in the following description. Descriptions of well-known components and processing techniques are omitted so as to not unnecessarily obscure the embodiments herein. The examples used herein are intended merely to facilitate an understanding of ways in which the embodiments herein may be practiced and to further enable those of skill in the art to practice the embodiments herein. Accordingly, the examples should not be construed as limiting the scope of the embodiments herein.

As mentioned, there remains a need for a system and a method to design better LDPC decoder which supports different standards and to avoid/minimize memory access conflicts without making changes in the existing hardware architecture. The embodiments herein achieve this by (i) generating a set of control signals in offline by analyzing an H-matrix, and (ii) storing the set of control signals in an on-chip memory. An offline analysis enables support of new H-matrix structures and update to decoder control signal memory without changing the hardware design of the decoder. Control signals pertaining to one layer is stored in one or more locations of a control signal storage memory. Re-ordering of one or more layers is achieved by storing the set of control signals in a desired order. Referring now to the drawings, and more particularly to FIGS. 1 through 7, where similar reference characters denote corresponding features consistently throughout the figures, preferred embodiments are shown.

Low-density parity-check codes (LDPC) are forward error correction (FEC) codes that are used for transmitting messages over noisy transmission channels. The low-density parity-check codes are formed by appending parity bits to a message to be transmitted. The low-density parity-check code is specified through a matrix called H-matrix, which specifies how parity bits are calculated from various message bits. A transmitter performs an LDPC encoding function while a receiver performs a decoding function.

FIG. 1 is a block diagram 100 illustrates an implementation of a low-density parity check decoder in a receiver according to an embodiment herein. The block diagram 100 includes a tuner and ADC block 102, a signal conditioning unit 104, FFT/channel estimation 106, a demapper and de-interleaver 108, a LDPC decoder 110, and an output processing 112. The tuner and ADC block 102 receives an input signal from an antenna. The signal conditioning unit 104 may include an IF to baseband block, an adjacent channel filter block, and a sample rate converter block. The IF to baseband block converts the input signal (e.g., an IF signal) to a baseband signal. The adjacent channel filter block rejects the adjacent channels from the baseband signal. The sample rate converter block samples the baseband signal. The sampling of the baseband signal is different from the baseband rate. The FFT/channel estimation 106 performs a Fast Fourier transformation of a baseband data and the size of the FFT is equal to the detected mode.

The FFT/channel estimation 106 estimates a channel based on pilot information transmitted by the transmitter. In one embodiment, the demapper and de-interleaver 108 arrives at a soft decision value for each bit based on a channel estimation data and comparison with ideal constellation symbol values. The LDPC decoder 110 may compute a set of control signals off-chip for handling various H-matrices. The set of control signals which are generated may be stored into the on-chip memory device at boot time, and may drive configurable hardware to decode different LDPC standards. The output processing 112 gets decoded bits as input and performs protocol-specific processing to derive a final transport stream, in an example embodiment.

Figure 2:
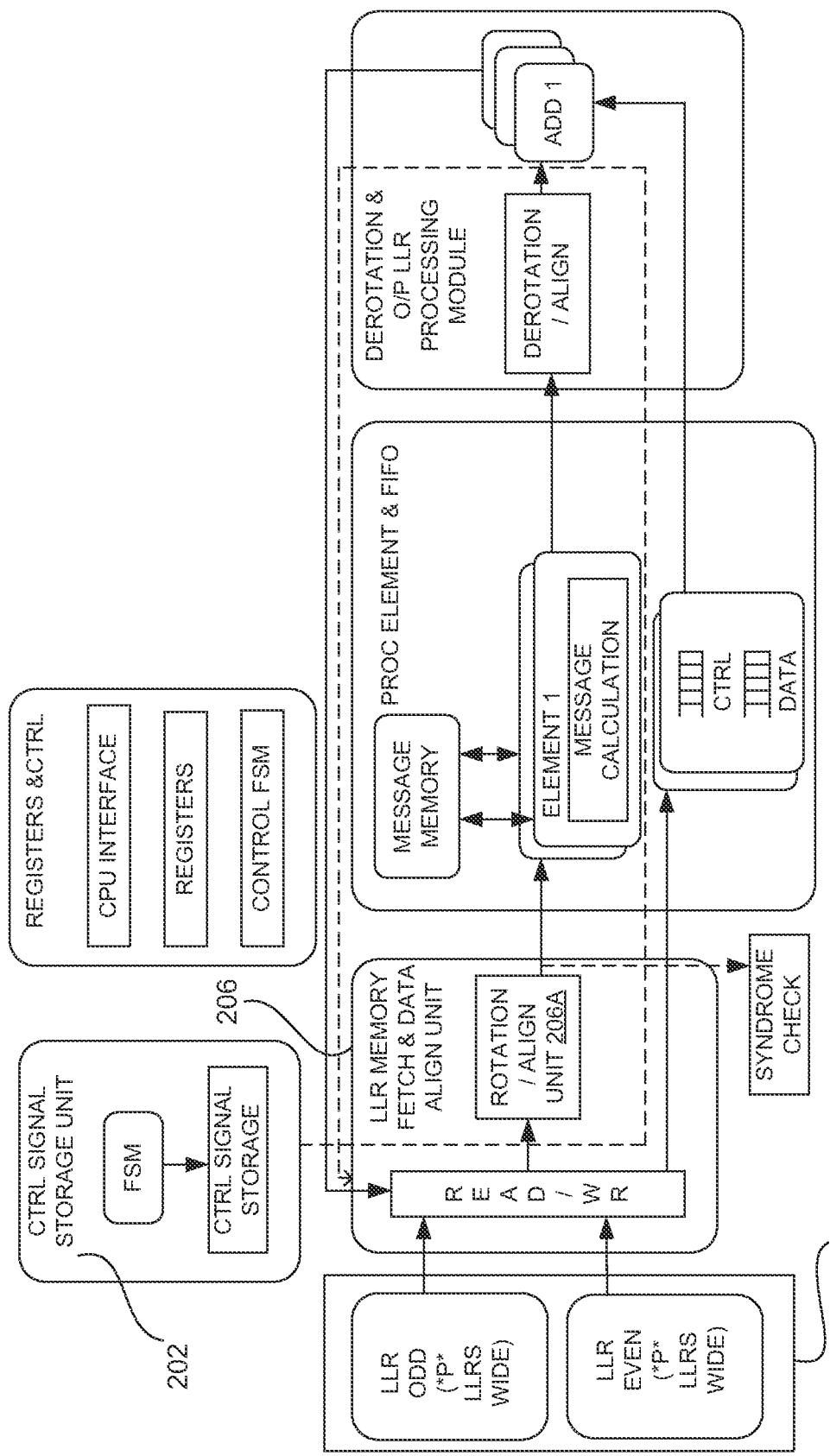
FIG. 2 is a system view illustrates a multi-standard LDPC decoder implementation according to an embodiment herein.

FIG. 2 is a system view 200 illustrates a multi-standard LDPC decoder implementation according to an embodiment herein. A control signal storage unit 202 stores the set of control signals (e.g., pre computed control signals) to decode different H-Matrices belonging to different standards and code rates according to the embodiments herein. The multi-standard LDPC decoder 200 includes the control signal storage unit 202, a LLR memory unit 204, and a LLR memory fetch and rotation unit 206. The set of control signals may be stored in the control signal storage unit 202 in an example embodiment. The LDPC decoder may compute the control signals off-chip for handling various H-matrices. The structure of the decoder may be generalized to process any H-matrix. In one embodiment, the structure of the decoder is generalized to process any sparse H-matrix by masking out selected processing elements depending on H-matrix configuration. The decode operation for any H-matrix is performed in one or more steps. The set of control signals which are generated that may be stored into the on-chip memory device at boot time. The set of control signals can drive configurable hardware to decode different LDPC standards. In one embodiment, for generating the control signals, a pre-compute process takes one diagonal at a time from the input H-Matrix and generates the corresponding control signals for that diagonal. The order in which control signals are stored in memory may decide the order of layer processing. In one example embodiment, the pre-compute process may also take the layer re-order information as input and generate the control signals, so that the hardware processes the layers may be in a desired order.

The LLR memory fetch & data align unit 206 further includes a rotation/align unit 206A. The rotation/align unit 206A may include a configurable rotator (or barrel shifter) which aligns valid LLR bytes from the input LLRs, which are sent to the processing elements (PE) in proper order. The barrel shifter rotator can handle varying number of LLRs. The de-rotation and OP LLR processing module have configurable de-rotators (barrel shifter performs reverse operation as that of the rotators). The de-rotators may be programmed to shift varying length of input data, making it possible to align the different number of LLR data for different standards.

In one embodiment, the configurable hardware is, a LLR memory access unit which can access configurable number of LLR bytes from the memory. The number of bytes accessed in a cycle is decided by the number of rows present in one layer. The number of rows per layer may change depending on the H-matrix. In one embodiment, the number of LLR bytes depends on the number of rows in the layer. Then, the configurable barrel shifter aligns the LLR bytes before sending to the processing elements. As the number of rows processed in one layer can vary, one or more control signals are generated to disable one or more processing elements. Then finally, one or more updated LLRs are de-rotated and written back to LLR memory. The de-rotator is capable of handling rotate operation with different number of LLR bytes.

Figure 3:
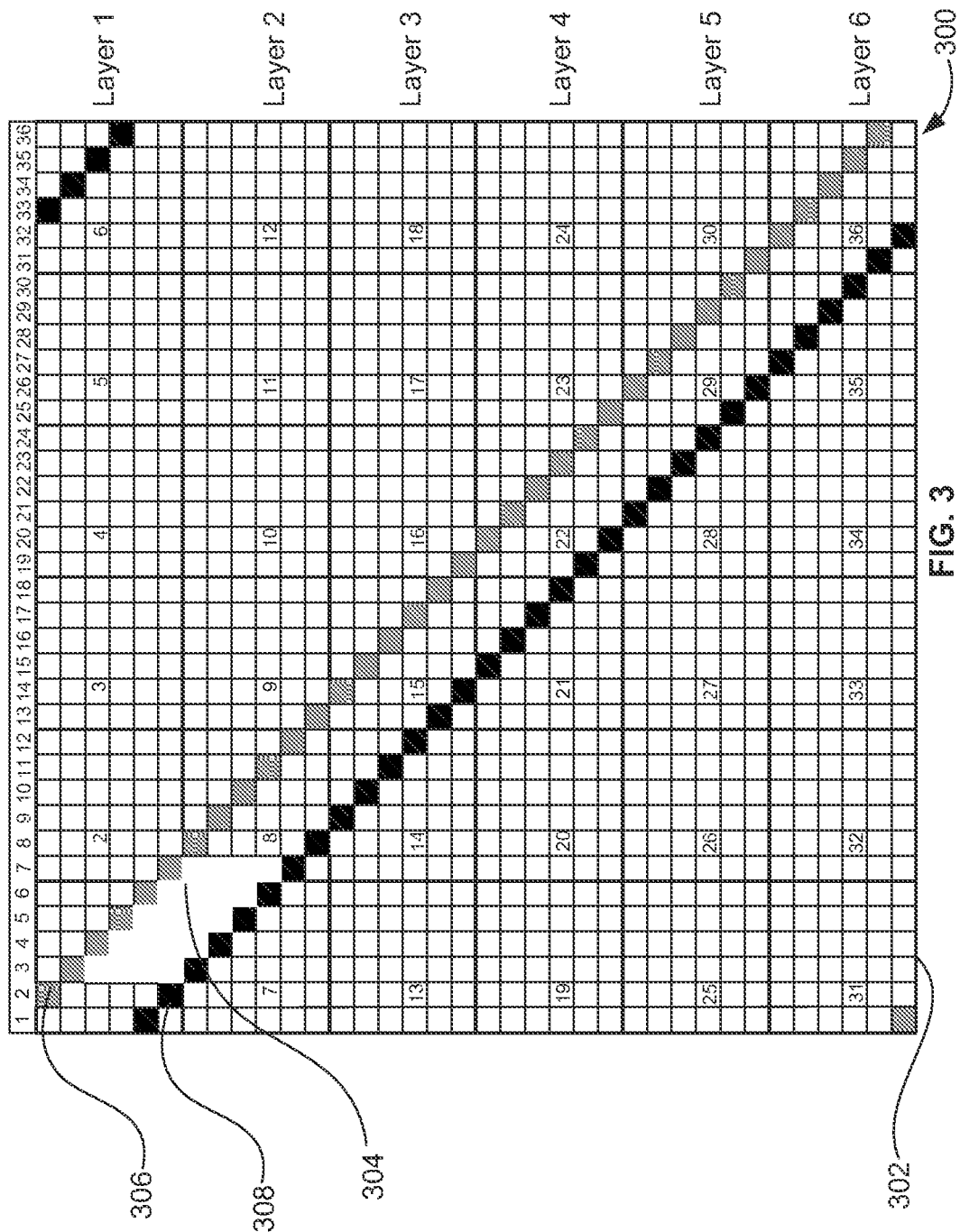
FIG. 3 illustrates a graphical representation of a sample sub-matrix according to an embodiment herein.

FIG. 3 illustrates a graphical representation of a sample sub-matrix 300 according to an embodiment herein. A sub matrix 302 may be a shifted Identity-Matrix with one or more diagonals (e.g., may or may not be zero aligned) within the H-Matrix. For example, LLRs of 1 layer are fetched one diagonal at a time. 'P' number of LLRs in one cycle is required to feed all 'P' processing elements (PE). Hence one or more 'P' LLRs are stored in one location of the LLR memory. Consider an example of diagonal-1 306 with P=6. Then for obtaining 'P' valid LLRs (requires to fetch 2P LLRs in one cycle) LLRs 2-7 are fetched. Similarly, one or more LLRs are to be fetched from both ODD (LLR 1-6) and EVEN banks (LLR 7-12) and then extracting the valid 'P' LLRs.

In one embodiment, the sub matrix 302 consists of layer 1 to layer 6. For example, when the rows are rearranged in a DVB-T2/S2 receiver with size of LDPC submatrix 360×360, the current layer being processed may need the decoded data from previous layer/layers. If a data path is pipelined to achieve higher throughput, the computation of the previous layer may be incomplete, when data for next layer is fetched. Similarly, if there is a data dependency, the pipeline gets stalled to prevent functional error, leading to lower throughput. In one embodiment, when a layer in the H-Matrix is having data dependency with the previous layer or layers, then that layer is scheduled for processing after the layers on which this layer is dependent. Once the layer processing is performed, the dependent layer gets the updated data without having to stall the pipeline.

For example, a class of H-matrices as used in DVB series of standards leads to an issue of data conflicts while performing an LDPC decoding. Hence there is need to obtain optimum order of layer processing such that the number of data access conflicts is minimized. If a better sequence of layer processing is identified even after the design is fabricated, a new sequence may be used for better power/throughput since the order of layer processing is not hardcoded. The order of processing of different layers may be dependent to an order of control signal storage in decoder memory. Hence there is a possibility to change the order of layer processing by changing the content of the control signal memory without having to change the entire hardware design.

For example, assume that a layer has 60 rows, a ½ DVB-T2, the rearranged H-matrix may have (32400/60)=540 layers. Ordering the layers in advance may help in avoiding the data conflict to a great extent. In one embodiment, there is a data dependency between Layer-1 and Layer-2. The data conflict in the conflict zone 304 may be avoided when layer-3 is picked for processing before Layer-2. The analysis may be performed on the entire H-Matrix to find the best solution of ordering of the layers. In one example embodiment, by performing a better re-ordering solution the throughput may be improved compared to processing the data without any re-ordering.

Figure 4:
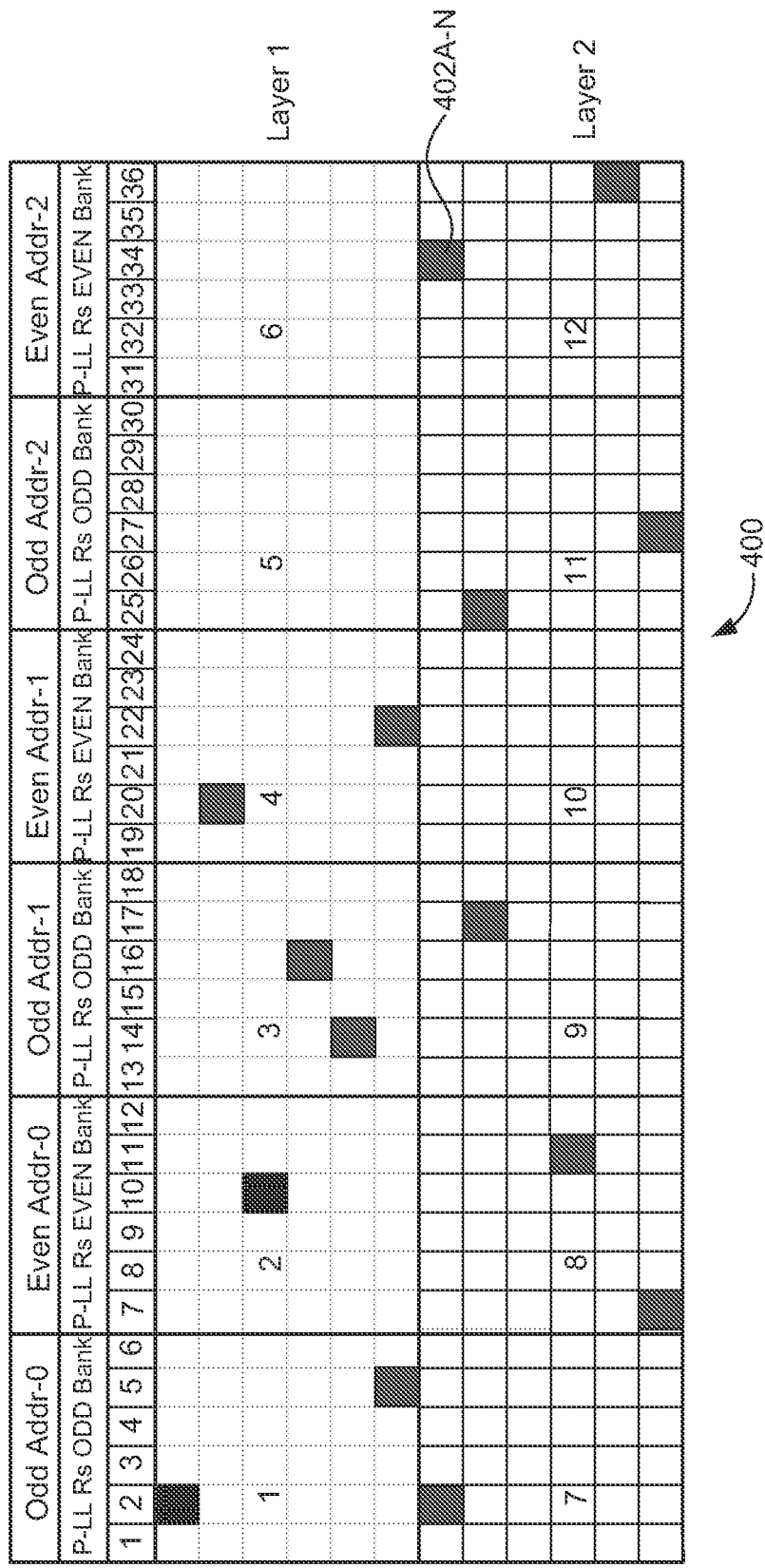
FIG. 4 illustrates a graphical representation of a sample sub-matrix according to an embodiment herein.

FIG. 4 illustrates a graphical representation of a sample sub-matrix 400 according to an embodiment herein. In the H-Matrix one or more active elements 402A-N (e.g., active elements located at random locations) is not in form of the shifted identity-matrix. The operational sequence are (i) generate read enables only to memory instances where one or more active elements 402A-N are present, and (ii) enabling the processing elements (PEs) only to which the active elements are being sent. Once the decoder starts its operation, it fetches the stored control signals and the set of control signals are sent to the LLR memory fetch & data align unit 206. The control signals may be received from the control signal storage unit 202 and fetches the data from the LLR memory unit 204. The number of LLR bytes fetched from the LLR memory unit 204 may depend upon the number of rows in one layer. In one embodiment, a set of control signals are generated offline (e.g., read enables are generated and stored based on an H-Matrix). For example, only two active elements are present in ODD address-0, at the position two & five for layer-1, (ii) read enables are generated only for the LLR memory instance two & five at ODD address 0, (iii) once one or more LLRs are fetched, sent to a processing elements one (e.g., PE-1) and a processing elements six (e.g., PE-6) and rest processing elements are disabled, and (iv) once the LLRs are being processed, written to same locations from where the LLRs are read. The LLR memory may be read multiple times when the h-matrix does not follow a diagonal structure.

Figure 5:
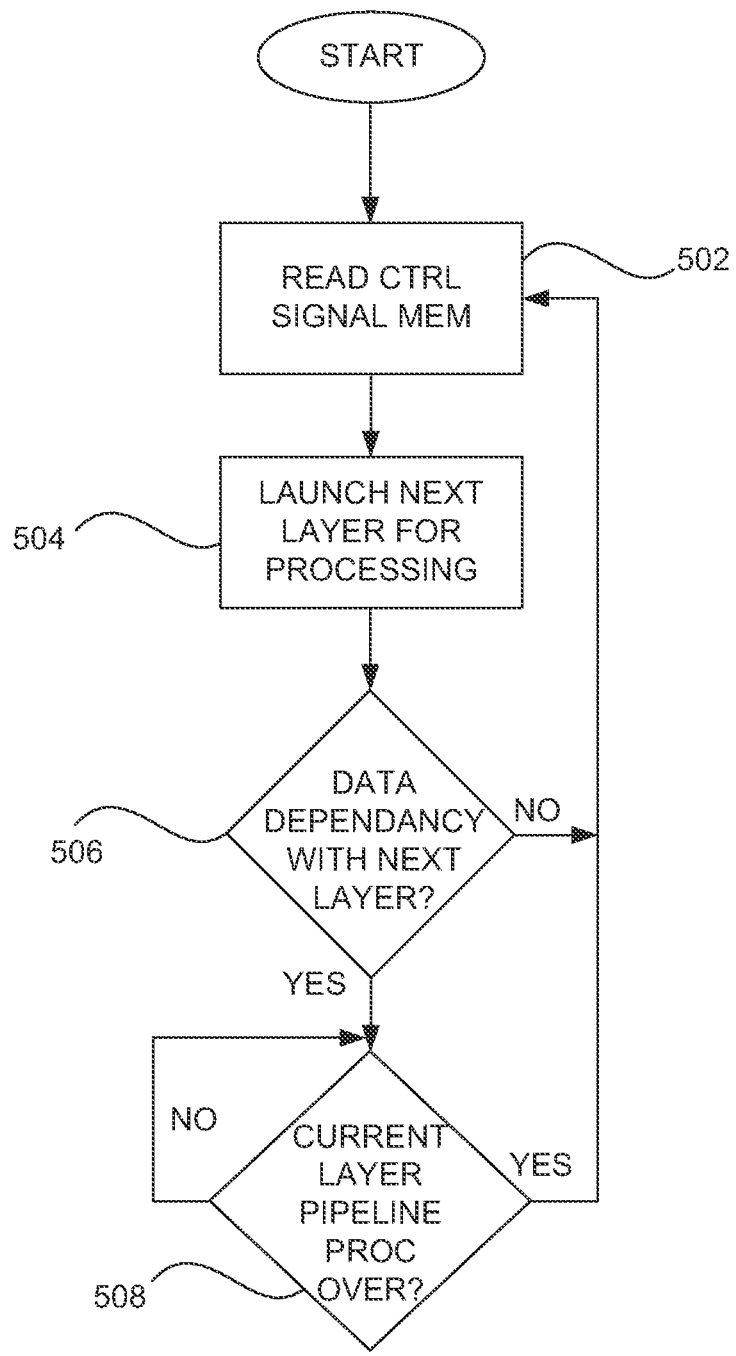
FIG. 5 is a flow diagram illustrating a method for accessing the control signals from a control signal memory according to an embodiment herein.

FIG. 5 is a flow diagram illustrating a method for accessing the control signals from a control signal memory according to an embodiment herein. In step 502, the control signal memory is read. In step 504, a next set of data is read from LLR memory and launched into a processing pipeline. In step 506, check if there is a dependency between the data of a current layer and the next layer. The dependency may be analyzed during off-chip control signal generation. Presence of data dependency after any stage may be indicated through a flag in a single control signal memory entry. In step 508, check if the data of the current layer is completely processed. For example, if such dependency is detected, the control logic may not launch further signals into the processing pipeline until the current set of data is completely processed.

Figure 6:
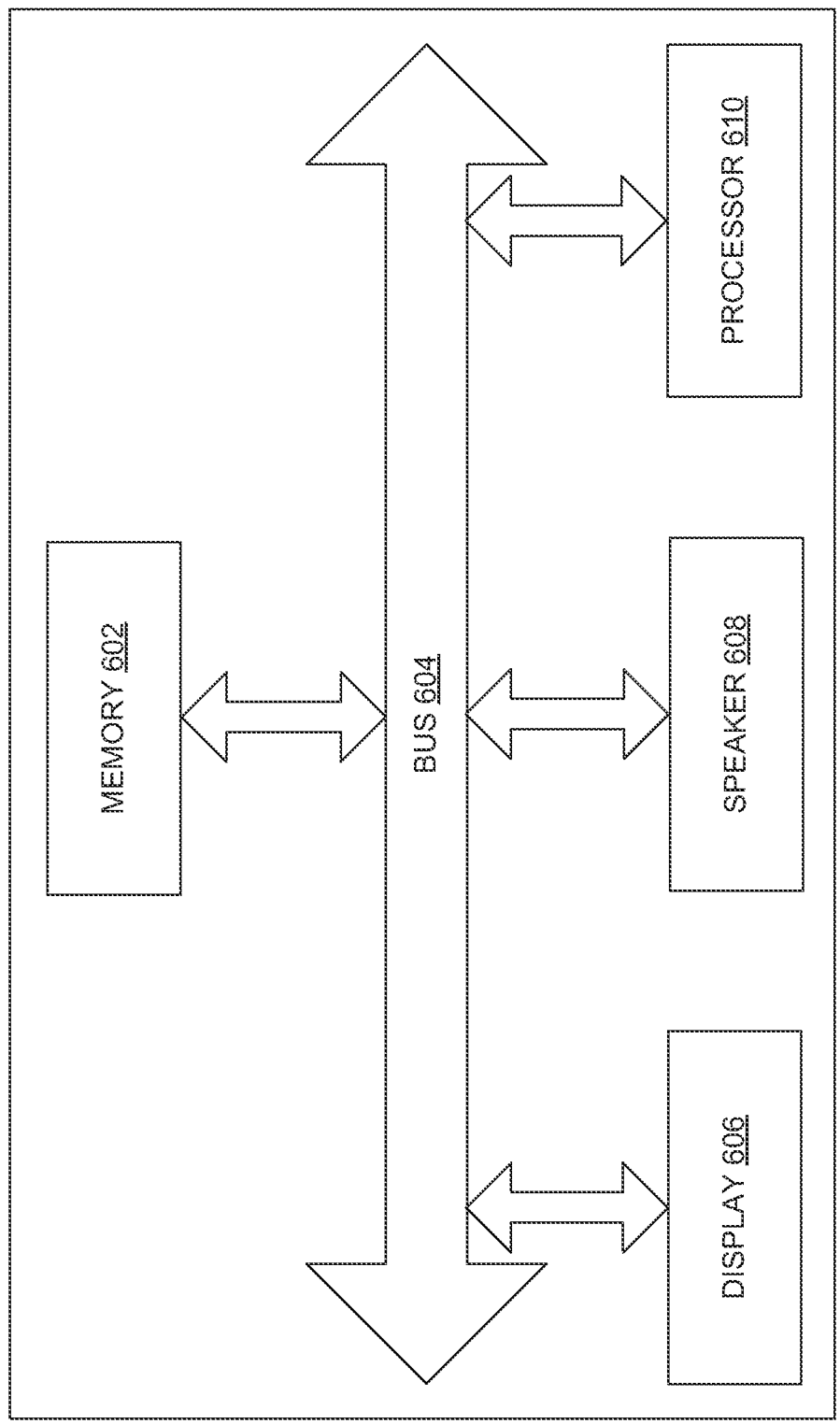
FIG. 6 illustrates an exploded view of a receiver used in accordance with the embodiments herein.

FIG. 6 illustrates an exploded view of a receiver, having a memory 602 having a set of computer instructions, a bus 604, a display 606, a speaker 608, and a processor 610 capable of processing a set of instructions to perform any one or more of the methodologies herein, according to an embodiment herein. The processor 610 may also enable digital content to be consumed in the form of video for output via one or more displays 606 or audio for output via speaker and/or earphones 608. The processor 610 may also carry out the methods described herein and in accordance with the embodiments herein.

Digital content may also be stored in the memory 602 for future processing or consumption. The memory 602 may also store program specific information and/or service information (PSI/SI), including information about digital content (e.g., the detected information bits) available in the future or stored from the past. A user of the receiver may view this stored information on display 606 and select an item of for viewing, listening, or other uses via input, which may take the form of keypad, scroll, or other input device(s) or combinations thereof. When digital content is selected, the processor 610 may pass information. The content and PSI/SI may be passed among functions within the receiver using the bus 604.

The techniques provided by the embodiments herein may be implemented on an integrated circuit chip (not shown). The chip design is created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer transmits the resulting design by physical means (e.g., by providing a copy of the storage medium storing the design) or electronically (e.g., through the Internet) to such entities, directly or indirectly.

The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The embodiments herein can take the form of, an entirely hardware embodiment, an entirely software embodiment or an embodiment including both hardware and software elements. The embodiments that are implemented in software include but are not limited to, firmware, resident software, microcode, etc. Furthermore, the embodiments herein can take the form of a computer program product accessible from a computer-usable or computer-readable medium providing program code for use by or in connection with a computer or any instruction execution system. For the purposes of this description, a computer-usable or computer readable medium can be any apparatus that can comprise, store, communicate, propagate, or transport the program for use by or in connection with the instruction execution system, apparatus, or device.

The medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include compact disk-read only memory (CD-ROM), compact disk-read/write (CD-R/W) and DVD.

A data processing system suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output (I/O) devices (including but not limited to keyboards, displays, pointing devices, remote controls, etc.) can be coupled to the system either directly or through intervening I/O controllers. Network adapters may also be coupled to the system to enable the data processing system to become coupled to other data processing systems or remote printers or storage devices through intervening private or public networks. Modems, cable modem and Ethernet cards are just a few of the currently available types of network adapters.

Figure 7:
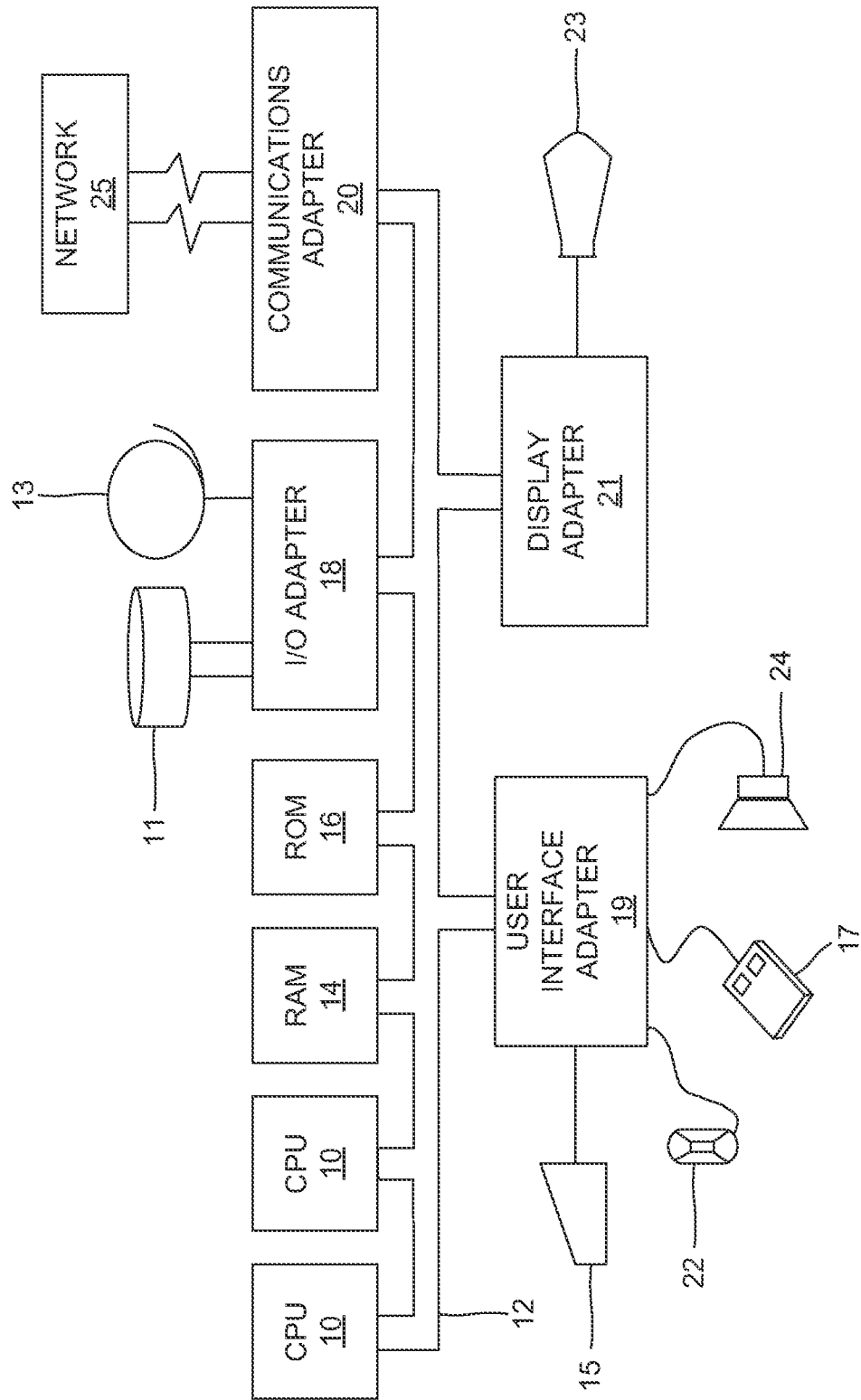
FIG. 7 illustrates a schematic diagram of a computer architecture used in accordance with the embodiments herein.

A representative hardware environment for practicing the embodiments herein is depicted in FIG. 7. This schematic drawing illustrates a hardware configuration of an information handling/computer system in accordance with the embodiments herein. The system comprises at least one processor or central processing unit (CPU) 10. The CPUs 10 are interconnected via system bus 12 to various devices such as a random access memory (RAM) 14, read-only memory (ROM) 16, and an input/output (I/O) adapter 18. The I/O adapter 18 can connect to peripheral devices, such as disk units 11 and tape drives 13, or other program storage devices that are readable by the system. The system can read the inventive instructions on the program storage devices and follow these instructions to execute the methodology of the embodiments herein.

The system further includes a user interface adapter 19 that connects a keyboard 15, mouse 17, speaker 24, microphone 22, and/or other user interface devices such as a touch screen device (not shown) or a remote control to the bus 12 to gather user input. Additionally, a communication adapter 20 connects the bus 12 to a data processing network 25, and a display adapter 21 connects the bus 12 to a display device 23 which may be embodied as an output device such as a monitor, printer, or transmitter, for example.

Figure 8:
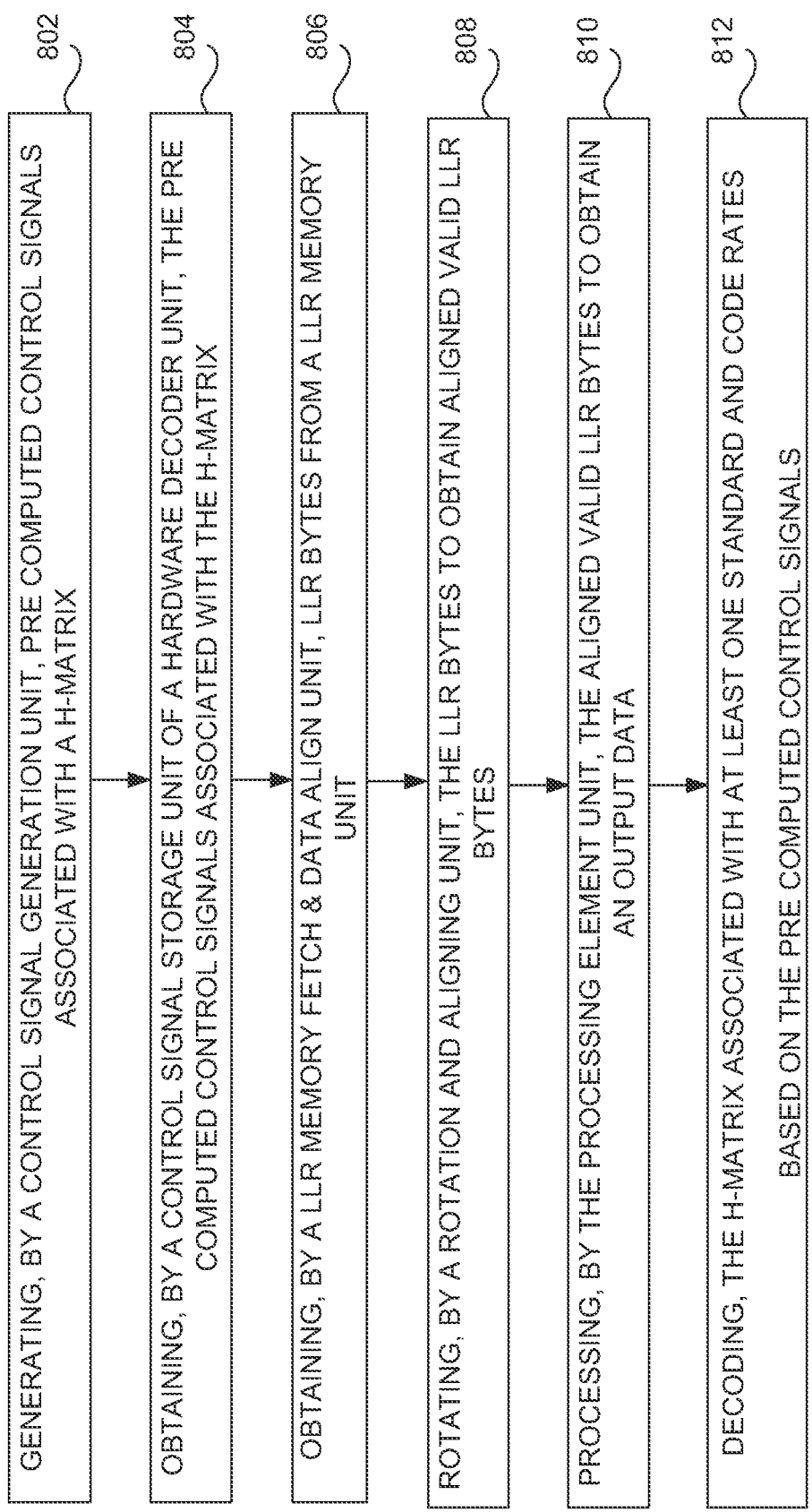
FIG. 8 is a flow diagram illustrating a method for implementing multi standard programmable low-density parity check decoder in a receiver.

FIG. 8 is a flow diagram illustrating a method for implementing multi standard programmable low-density parity check decoder in a receiver. In step 802, pre computed control signals associated with an h-matrix are generated by a control signal generation unit. In step 804, the pre computed control signals associated with the h-matrix are obtained by a control signal storage unit of a hardware decoder unit. In step 806, LLR bytes from a LLR memory unit are obtained by a LLR memory fetch & data align unit. A number of LLR bytes that are fetched from the LLR memory unit based on number of rows in a layer of the h-matrix. In step 808, the LLR bytes are rotated by a rotation and aligning unit to obtain aligned valid LLR bytes. The aligned LLR bytes are communicated to a processing element unit. In step 810, the aligned valid LLR bytes processed by the processing element unit to obtain an output data. The output data is an intermediate LLR value. A number of processing elements are enabled based on at least one of (a) a number of rows in a layer, and (b) a location of active elements of the H-matrix within a current layer. In step 812, the h-matrix associated with at least one standard and code rates are decoded based on the pre computed control signals.

The one or more sub matrices associated with the H-matrix may be a shifted identity-matrix with at least one diagonal. The p-number of processing elements may present in a data path to process p-number of rows at a particular period. The pre computed control signals may be generated based on layer re-order information. The layer re-order information may include an order of layer processing. The control signal generation unit may be further configured to schedule a layer for processing when the layer in said H-matrix includes data dependency corresponding to at least one previous layer.

The method may further include, a configurable number of LLR bytes from the memory may be obtained by a LLR memory access unit. A number of LLR bytes obtained in a cycle may be based on at least one of (i) a number of rows in a layer, and (ii) a location of active elements of the H-matrix within a current layer. The H-Matrix may be not a shifted identity-matrix when at least one active element located at random locations. The one or more active element are mapped to corresponding at least one processing elements. The method may further include, the output data of the processing element unit are de-aligned by a de rotation unit. The LLR bytes may be shifted in a reverse direction based on the rotation. The method may further include an output LLR bytes are generated by an output processing unit, based on a feedback from one or more diagonals and an input LLR values.

Since the control signals are generated offline, this enables the LDPC decoder to perform decode operations for any H-matrix. Based on block length, number of layers, maximum row weight, existence of data conflict between contiguous layers and number of diagonal in a sub matrix the pre-compute process (e.g., implemented in C-language or behavioral Verilog) may generate the set of control signals for a particular standard/code rate. The memory conflicts can be reduced and throughput increased by making an optimum choice of the order in which layers are processed. The system uses a flexible architecture to implement LDPC decoders for multiple standards. Also the behavioral model generates the control signals off line. Hence it takes these computations off the chip, making the control path simple. It additionally gives the flexibility to add even newly designed H-Matrix as it is a fully programmable solution.

In one embodiment, the newly designed LDPC code may also be implemented, which is unknown at the time of the design of this hardware. The requirement is to generate the corresponding control signals of the H-Matrix. A better layer reordering solution can be implemented even after design fabrication, in place of current reordering solution as this is fully programmable, to have better results in terms of throughput as well as power saving. This scheme enables reordering of H-matrix layers to avoid access conflicts. The low density parity check code finds a wide variety of applications including data communications, magnetic recording and other applications where there is a need to transmit messages over noisy transmission channels.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Therefore, while the embodiments herein have been described in terms of preferred embodiments, those skilled in the art will recognize that the embodiments herein can be practiced with modification within the spirit and scope of the appended claims.

What is claimed is:

1. A system for implementing multi standard programmable low-density parity check decoder in a receiver, said system comprising:
a control signal generation unit comprising a behavioral model that generates one or more control signals associated with a h-matrix based on an offline analysis of said h-matrix, wherein said one or more control signals comprises a stall flag for controlling a read operation from an log-likelihood ratio (LLR) memory based on a data dependency between consecutive layers of said h-matrix; and
a hardware decoder unit communicatively associated with said control signal generation unit, wherein-said hardware decoder unit comprises:
a control signal storage unit, that stores said generated one or more control signals associated with said h-matrix in an order based on an optimal order of processing one or more layers of said h-matrix for enabling re-programming of said hardware decoder unit based on said generated one or more control signals;
a LLR memory fetch & data align unit, that obtains one or more LLR bytes from a LLR memory unit, wherein a number of LLR bytes that are fetched from said LLR memory unit is based on a number of rows in a layer of said h-matrix, said LLR memory fetch & data align unit comprising:
a rotation and aligning unit, that is configured to perform a programmable rotation on said LLR bytes based on a structure of said h-matrix to obtain aligned valid LLR bytes, wherein an amount of said programmable rotation is indicated in said one or more control signals, and wherein said aligned LLR bytes is communicated to a processing element unit; and
said processing element unit comprising one or more processing elements, that processes said aligned valid LLR bytes to obtain an output data, wherein said output data comprises one or more intermediate LLR values, wherein a number of processing elements from among said plurality of processing elements are selectively enabled based on at least one of (i) a number of rows in a layer, and (ii) a location of an active elements of said h-matrix within said layer,
wherein said one or more processing elements are selectively enabled based on said one or more control signals associated with said h-matrix, and wherein upon said layer having a data dependency with a previous one or more layers, based on said stall flag of said one or more controls signals, said layer is scheduled for processing subsequent to said previous one or more the layers on which said layer is dependent as indicated by said one or more control signals generated by said behavioral model; and a de-rotation and output LLR processing module, that is configured to:
perform a reverse rotation of said output data of said processing element unit for aligning said one or more intermediate LLR values with a corresponding LLR byte, wherein said one or more intermediate LLR values are shifted in a reverse direction based on said reverse rotation;
add said reverse rotated intermediate LLR values to said corresponding LLR value; and
write said added LLR value to said LLR memory.

2. The system of claim 1, wherein at least one of sub matrices associated with said h-matrix is a shifted identity-matrix with at least one diagonal, wherein a predetermined number of processing elements are present in a data path to process a predetermined number of rows at a time.

3. The system of claim 1, wherein said one or more control signals are generated based on a layer re-order information, wherein said layer re-order information comprises an order of layer processing.

4. The system of claim 1, wherein said control signal generation unit is further configured to stall a processing pipeline based on said stall flag to schedule a layer for processing upon said layer in said h-matrix comprising data dependency corresponding to at least one previous layer.

5. The system of claim 1, further comprising a LLR memory access unit configured to access a configurable number of LLR bytes from said LLR memory unit, wherein said configurable number of LLR bytes accessed in a cycle are based on at least one of (i) a number of rows in a layer, and (ii) a location of one or more active elements of said h-matrix within a current layer, and wherein said configurable number of LLR bytes is indicated by said generated one or more control signals.

6. The system of claim 1, wherein said h-matrix is not a shifted identity-matrix when at least one active element located at random locations, wherein said at least one active element is mapped to corresponding at least one processing element from among said one or more processing elements.

7. A method for implementing multi standard programmable low-density parity check decoder in a receiver, said method comprising:
(i) generating, by a behavioral model of a control signal generation unit, one or more control signals associated with a h-matrix based on offline analysis of said h-matrix, wherein said one or more control signals comprises a stall flag for controlling a read operation from an log-likelihood ratio (LLR) memory based on a data dependency between one or more layers of said h-matrix;
(ii) storing, in a control signal storage unit of a hardware decoder unit, said generated one or more control signals associated with said h-matrix, wherein said generated one or more control signals are stored in said control signal storage unit in an order based on an optimal order of processing one or more layers of said h-matrix for enabling re-programming of said hardware decoder unit based on said generated one or more control signals;
(iii) obtaining, by a LLR memory fetch & data align unit of said hardware decoder unit, one or more LLR bytes from a LLR memory unit, wherein a number of LLR bytes that are fetched from said LLR memory unit is based on a number of rows in at least one layer of said h-matrix;
(iv) programmably rotating, by a rotation and aligning unit, said aligned LLR bytes based on a structure of said h-matrix to obtain aligned valid LLR bytes, wherein an amount of said programmable rotation is indicated in said generated one or more control signals based on said h-matrix, and wherein said aligned LLR bytes is communicated to a processing element unit;
(v) processing, by said processing element unit comprising a plurality of processing elements, said aligned valid LLR bytes to obtain an output data, wherein said output data comprises one or more intermediate LLR values, wherein a number of processing elements from among said plurality of processing elements are selectively enabled based on at least one of (a) a number of rows in a layer, and (b) a location of an active element of said h-matrix within said layer,
wherein said processing elements are selectively enabled based on said one or more control signals associated with said h-matrix, and wherein upon said layer having a data dependency with a previous one or more layers, based on said stall flag of said one or more controls signals, said layer is scheduled for processing subsequent to said previous one or more layers on which said layer is dependent on as indicated by said one or more control signals generated by said behavioral model; and
(vi) performing by a de-rotation and output LLR processing module:
a reverse rotation of said output data of said processing element unit for aligning said one or more intermediate LLR values with a corresponding LLR byte, wherein said one or more intermediate LLR values are shifted in a reverse direction based on said reverse rotation;
adding said reverse rotated intermediate LLR values to said corresponding LLR value; and
writing said added LLR value to said LLR memory.

8. The method of claim 7, wherein at least one of sub matrices associated with said h-matrix is a shifted identity-matrix with at least one diagonal, wherein a predetermined number of processing elements are present in a data path to process a predetermined number of rows at a at a time.

9. The method of claim 7, wherein said one or more control signals are generated based on a layer re-order information, wherein said layer re-order information comprises an order of layer processing based on a structure of said h-matrix.

10. The method of claim 7, further comprising:
stalling a processing pipeline based on said stall flag to schedule a layer for processing upon said layer in said h-matrix comprising data dependency corresponding to at least one previous layer.

11. The method of claim 7, further comprising, obtaining, by a LLR memory access unit a configurable number of LLR bytes from said LLR memory unit, wherein said configurable number of LLR bytes obtained in a cycle are based on at least one of (i) a number of rows in a layer, and (ii) a location of one or more active elements of said h-matrix within a current layer, and wherein said configurable number of LLR bytes is indicated by said generated one or more control signals.

12. The method of claim 7, wherein said h-matrix is not a shifted identity-matrix when at least one active element is located at random locations, wherein said at least one active element is mapped to corresponding at least one processing element from among said one or more processing elements.

\* \* \* \* \*